(12) United States Patent
Lee et al.

(10) Patent No.: US 7,294,963 B2
(45) Date of Patent: Nov. 13, 2007

(54) ELECTRO-LUMINESCENCE DISPLAY DEVICE AND METHOD OF FABRICATING THE SAME

(75) Inventors: Jung Hwan Lee, Daegu (KR); Hyo Dae Bae, Daegu (KR)

(73) Assignee: LG Electronics Inc., Seoul (KR)

( * ) Notice: Subject to any disclaimer, the term of this patent is extended or adjusted under 35 U.S.C. 154(b) by 376 days.

(21) Appl. No.: 10/901,226

(22) Filed: Jul. 29, 2004

(65) Prior Publication Data

US 2005/0057146 A1 Mar. 17, 2005

(30) Foreign Application Priority Data

Jul. 31, 2003 (KR) ...................... 10-2003-0052980

(51) Int. Cl.
*H05B 33/06* (2006.01)

(52) U.S. Cl. .................................... 313/505; 315/169.3

(58) Field of Classification Search ........ 313/498–512; 315/169.3; 345/36, 45, 76
See application file for complete search history.

(56) References Cited

U.S. PATENT DOCUMENTS

| | | | | |
|---|---|---|---|---|
| 6,127,729 A | * | 10/2000 | Fukuda | ........................ 257/736 |
| 2004/0238818 A1 | * | 12/2004 | Kim | ............................ 257/48 |
| 2005/0042320 A1 | * | 2/2005 | Hasei | ......................... 425/375 |

* cited by examiner

*Primary Examiner*—Karabi Guharay
*Assistant Examiner*—Christopher Raabe
(74) *Attorney, Agent, or Firm*—Birch, Stewart, Kolasch & Birch, LLP

(57) ABSTRACT

An electro-luminescence display device includes a connection film being connected to a driving circuit, a pad connected to the connection film in order to supply a driving signal from the driving circuit to a signal line formed on a substrate, a conductive film for connecting the connection film to the pad, and a plurality of dummy pads. Each dummy pad includes a transparent conductive layer. At least one of the dummy pads is formed to expose the transparent conductive layer in order to test an adhesive level of the connection film and the pad by the conductive film.

5 Claims, 6 Drawing Sheets

ELECTRO-LUMINESCENCE DISPLAY DEVICE AND METHOD OF FABRICATING THE SAME

This application claims the benefit of Korean Patent Application No. P2003-52980 filed in Korea on Jul. 31, 2003, which is hereby incorporated by reference.

BACKGROUND OF THE INVENTION

1. Field of the Invention

The present invention relates to an electro-luminescence display device and, more particularly, to an electro-luminescence display device and a method of fabricating the same capable of saving working hours needed to fabricate the electro-luminescence display device and preventing a waste of materials to improve a production yield of the electro-luminescence display device.

2. Description of the Related Art

In recently, there has been developed various flat panel displays with a reduced weight and bulk that are free from the disadvantage of a cathode ray tube CRT. Such flat panel displays include a liquid crystal display LCD, a field emission display FED, a plasma display panel PDP, and an electro luminescence (hereinafter, referred to as an EL) display devices. The structure and fabricating process of the PDP among these is relatively simple. Thus the PDP is most advantageous to be made light and large-sized, but has disadvantages that the light emission efficiency and brightness thereof are low and its power consumption is high. Whereas, the LCD has a disadvantage that the power consumption is high because the LCD is difficult to be made large-sized and adopts a backlight unit. Further, the LCD has a disadvantage that there is a high optical loss caused by optical devices such as a polarizing filter, a prism sheet and a diffusion panel, and its viewing angle is narrow. As compared with the LCD, the EL display device is generally classified into an inorganic EL display device and an organic EL display device. The EL display device has an advantage that its response speed is fast, its light-emission efficiency and brightness are high and it has wide viewing angle. The organic EL display device can display a picture in a high brightness of several ten thousands [$cd/m^2$] with a voltage of about 10 [V].

A related art EL display device includes a display region having a pixel matrix and a non-display region except for the display region, on a substrate.

On the display region of the EL display device, an anode electrode and a cathode electrode are formed in a direction crossing each other. The anode electrode is separated from its adjacent anode electrodes by a predetermined distance on the substrate. An insulating film having an aperture at every EL cell region is formed on the substrate provided with the anode electrode. A barrier rib is located on the insulating film to separate each cell having the cathode electrode and an organic EL layer to be formed on the insulating film from adjacent cells. The barrier rib is formed in a direction across the anode electrode. The organic EL layer including an organic compound and the cathode electrode are sequentially deposited on an entire surface of the insulating film provided with the barrier rib. The organic EL layer includes a hole carrier layer, a light-emitting layer and an electron carrier layer which are stacked on the insulating film. According to the organic EL display device, when a driving signal is applied to the anode electrode and the cathode electrode, the electron and the hole are emitted from the anode electrode and the cathode electrode and the emitted electron and hole are re-combined each other in the organic EL layer, to thereby generate a visible light. The generated visible light is exited to an exterior via the anode electrode and is used to display a picture or image.

In the EL display device, as shown in FIGS. 1A to 1C, a pad part 2 of the non-display region is connected to a connection film such as a flexible print circuit FPC, a tape carrier package TCP and a chip on film COF in order to receive a driving signal from an exterior. Herein, the pad part 2 is connected to connection devices and includes a first pad 15 for receive the driving signal and a second pad 17 for aligning and testing an adhesive strength to the connection film as shown in FIGS. 1A to 1C. Herein, the second pad 17 can be formed in a variety of types, as shown in FIGS. 1A to 1C.

FIG. 2 is a sectional view illustrating an adhesion of the pad and the connection film of the driving circuit in a related art EL display device.

Each of the pads 15 and 17, as shown in FIG. 2, has a structure, in which a transparent conductive layer 21 connected to the anode electrode or the cathode electrode formed at the display region, and an opaque conductive layer 23 for raising a conductivity of the transparent conductive layer 21.

If a connection film 33 in which a base firm 35 and a copper material 37 are stacked is pressurized with respect to the pads 15 and 17 while positioning an anisotrophic conductive film ACF having conductive balls 25 between the connection film 33 and the pads 15 and 17, then the connection film 33 is electrically connected to the pads 15 and 17 by the conductive ball 25 pressurized between the pads 15 and 17, and the connection film 33.

Meanwhile, a separate destructive testing process is performed in the related art EL display device in order to confirm that the pads 15 and 17, and the connection film 33 are normally adhered through the use of the conductive film.

More specifically describing the destructive testing process, an adhesion of the pads 15 and 17, and the connection film 33 by the conductive film is performed using a parameter such as a predetermined pressure and strength. And then, the second pad 17 and the connection film 33 are separated from the conductive film. At this time, the parameter such as the adhesion level and the pressed strength between the second pad 17 and the connection film 33, and the conductive film is determined to settle a parameter for an optimum connection. The optimum parameter determined by the destructive testing process is used in the adhesion process to adhere the first pad 15 and the connection film 33 to the conductive film.

However, if the second pad 17 and the connection film 33, and the connection film are separated each other by the destructive testing process, then the second pad 17 and the connection film 33 thus separated cannot be used any more. Hereby, working hours needed to fabricate the EL display device becomes long by the number of times that the testing process is being performed. Further, the device subjected to the testing process should be abolished.

SUMMARY OF THE INVENTION

Accordingly, it is an object of the present invention to provide an electro-luminescence device and a method of fabricating the same capable of reducing working hours and preventing a waste of materials to improve a production yield by testing an adhesive level of a pad and a connection film of a driving circuit to a conductive film without requiring a separate destructive testing process.

In order to achieve these and other objects of the invention, an electro-luminescence device according to the present invention includes: a connection film being connected a driving circuit; a pad connected to the connection film in order to supply a driving signal from the driving circuit to a signal line formed on a substrate; a conductive film for connecting the connection film to the pad; and a plurality of dummy pads, each dummy pad including a transparent conductive layer, wherein at least one of the dummy pads as formed to expose the transparent conductive layer in order to test an adhesive level of the connection film and the pad by the conductive film.

Each of the dummy pads includes: an opaque conductive layer formed on the transparent conductive layer.

At least one of the dummy pads includes an alignment mark for aligning the connection film and the pad.

Any one of the dummy pads has a single-layer structure of the transparent conductive layer, and the remaining dummy pads have a double-layer structure of the transparent conductive layer and the opaque conductive layer.

The opaque conductive layer exposes at least a portion of the transparent conductive layer.

A method of manufacturing an electro-luminescence device according to the present invention includes: forming a dummy pad having a transparent conductive layer, a portion of transparent conductive layer being exposed; adhering the dummy pad and a connection film using a conductive film, the connection film being connected to a driving circuit; and testing an adhesive strength of the dummy pad and the connection film by the conductive film.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 3 to 6.

Figure 1A:
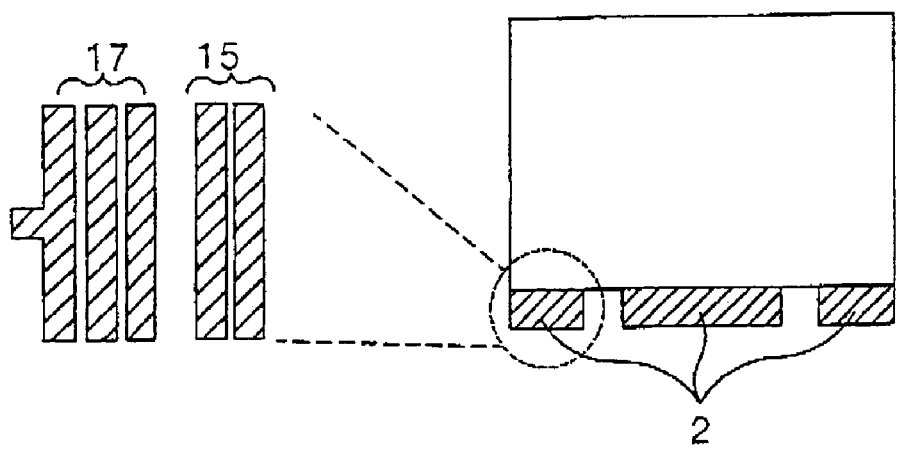
FIGS. 1A to 1C, are configurations illustrating a portion of a pad part of an electro-luminescence device.
Figure 1B:
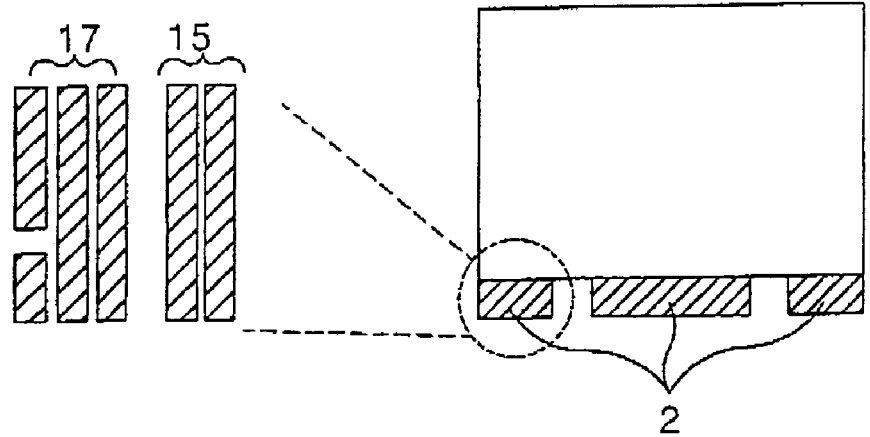
Figure 1C:
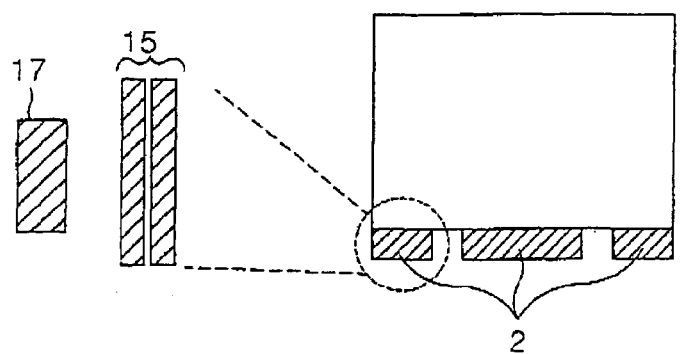
Figure 2:
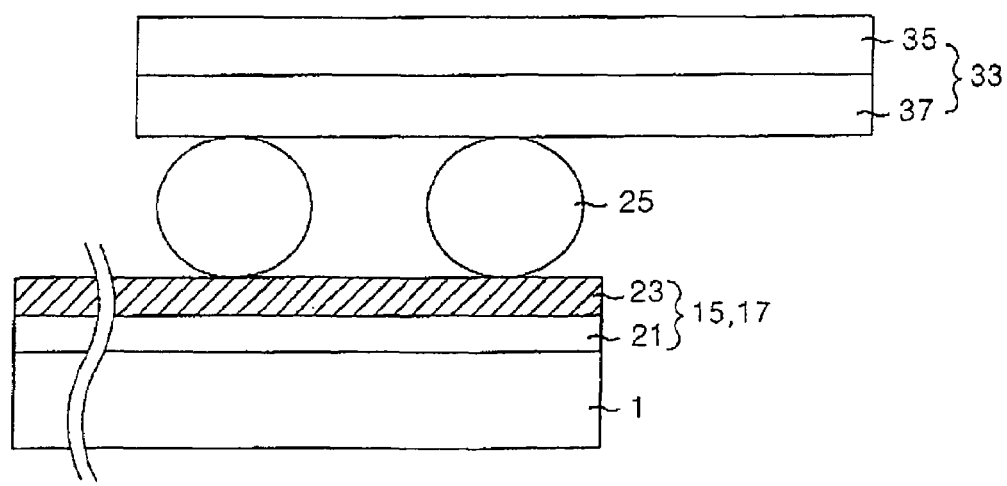
FIG. 2 is a configuration illustrating an adhesion of a connection film of a driving circuit and the pad shown in FIG. 1.
Figure 3:
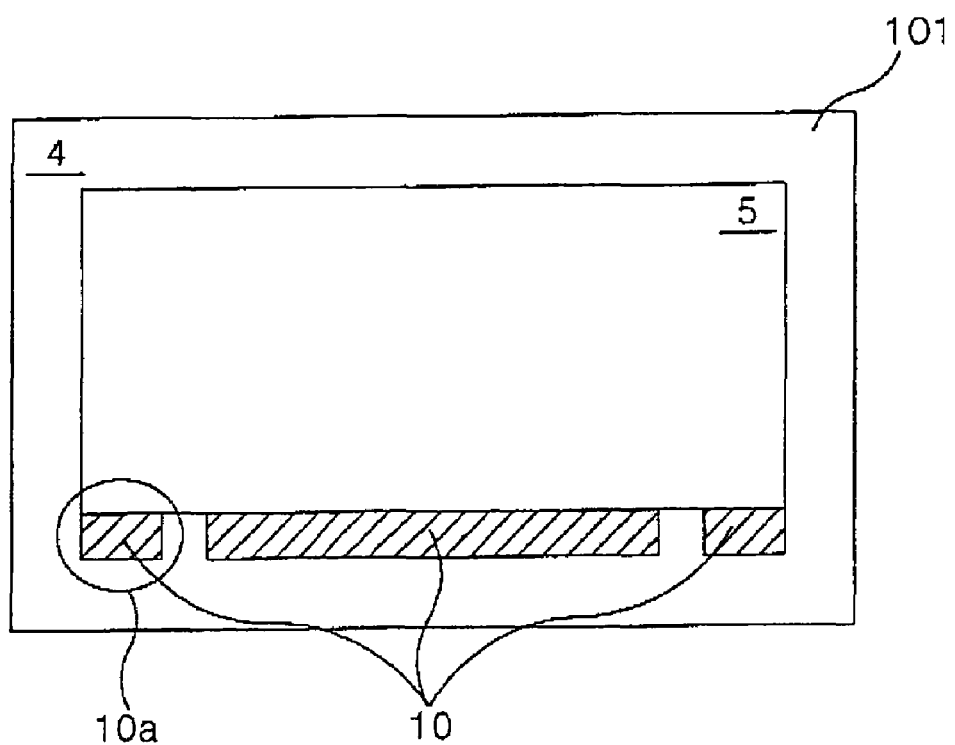
FIG. 3 is a configuration illustrating an electro-luminescence device according to an embodiment of the present invention.

FIG. 3 is a schematic diagram of an electro-luminescence (EL) device according to an embodiment of the present invention.

The EL display device shown in FIG. 3 includes a display region 5 having a pixel matrix and a non-display region 4 having a pad connected to signal lines of the display region 5, on a substrate 101.

Figure 4:
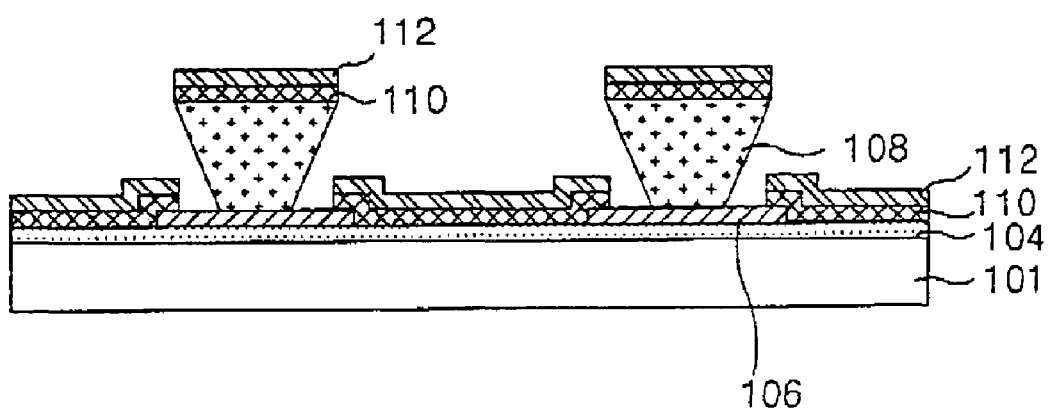
FIG. 4 is a sectional view illustrating a portion of a display region of the electro-luminescence device shown in FIG. 3.

On the display region 5 of the EL display device, as shown in FIG. 4, an anode electrode 104 and a cathode electrode 112 are formed in a direction crossing each other. The anode electrode 104 is separated from its adjacent anode electrodes by a predetermined distance on the substrate 101. An insulating film 106 having an aperture at every EL cell region is formed on the substrate 101 provided with the anode electrode 104. A barrier rib is located on the insulating film to separate each cell having the cathode electrode 112 and an organic EL layer 110 to be formed on the insulating film 106 from adjacent cells. The barrier rib 108 is formed in a direction across the anode electrode 104. The organic EL layer 310 including an organic compound, and the cathode electrode 112 are sequentially deposited on an entire surface of the insulating film 106 provided with the barrier rib 108. The organic EL layer 110 includes a hole carrier layer, a light-emitting layer and an electron carrier layer which are stacked on the insulating film 106. According to the organic EL display device, when a driving signal is applied to the anode electrode 104 and the cathode electrode 112, the electron and the hole are emitted from the anode electrode 104 and the cathode electrode 112, and the emitted electron and hole are recombined each other in the organic EL layer 110, to thereby generate visible light. At this time, the generated visible light is exited to an exterior via the anode electrode 104 and is used to display a picture or image.

In the EL display device, a pad part 10 of the non-display region 4 is connected to a connection film such as a flexible print circuit FPC, a tape carrier package TCP and a chip on film COF in order to receive a driving signal from an exterior.

Figure 5A:
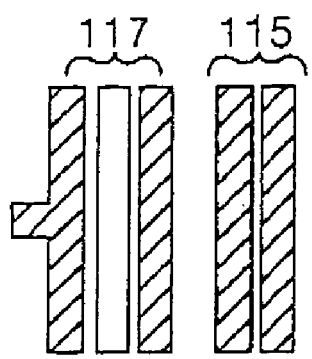
FIGS. 5A to 5C are configurations illustrating a portion of a pad part of the electro-luminescence device according to the embodiment of the present invention.
Figure 5B:
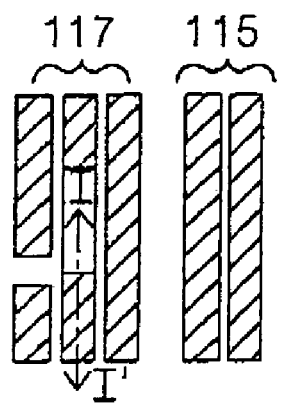
Figure 5C:
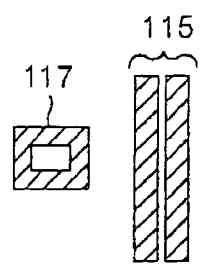
Figure 6:
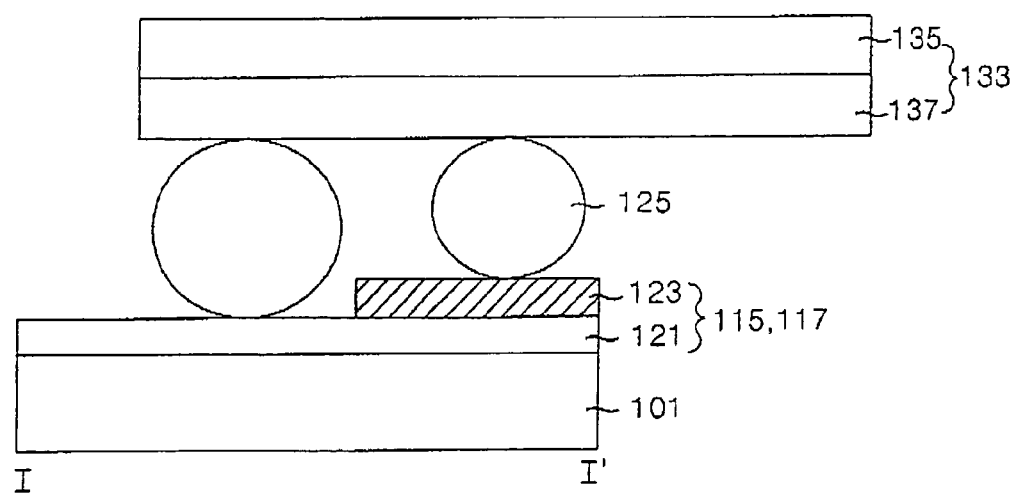
FIG. 6 is a configuration illustrating an adhesion of a connection film of a driving circuit and a second pad of the electro-luminescence device according to the embodiment of the present invention.

FIGS. 5A to 5C are detailed configurations of a portion 10a of the pad part 10, and FIG. 6 is a sectional view illustrating an adhesion of a connection film 133 of a driving circuit and a second pad 117 shown in FIGS. 5A to 5C.

Referring to FIGS. 5A to 6, the pad part 10 includes a first pad 115 for receiving the driving signal and a second pad 117 for aligning and testing an adhesive strength with the connection film. The second pad 117 can be formed in a variety of types for a purpose of aligning the pad part and the connection film, as shown in FIGS. 5A to 5C. For example, the second pad 117 has a protrusion as shown in FIG. 5A, a hole used for a aligning mark as shown in FIG. 5B, and a separate rectangular shape as shown in FIG. 5C.

Each of the pads 115 and 117 has a structure in which a transparent conductive layer 121 extending from the anode electrode or the cathode electrode formed at the display region 5, and an opaque conductive layer 123 for raising the conductivity of the transparent conductive layer 121. Meanwhile, at least one of second pads is formed to expose a portion of the transparent conductive layer 121 or to expose an entire surface of the transparent conductive layer 121, as shown in FIG. 6.

If a connection film 133 in which a base film 135 and a copper material 137 are stacked is pressurized with respect to the pads 115 and 117 while positioning an anisotrophic conductive film ACF having a conductive ball 125 between the connection film 133 and the pads 115 and 117, then the connection film 183 is electrically connected to the pads 115 and 117 by the conductive ball 125 pressurized between the pads 115 and 117, and the connection film 133.

In order to confirm that the pads 115 and 117, and the connection film 133 are normally and securely adhered through the use of the conductive film, a pressed strength of the conductive ball 125 is observed through an area from which the opaque conductive layer 123 of the second pad 117 is removed. Accordingly, it is possible to determine whether an adhesion of the pads 115 and 117, and the connection film 133 to the conductive film is securely made or not. More specifically, the conductive ball 125 is observed through a rear surface of the substrate 101 by use of a microscope. At this time, an adhesive level can be determined depending upon the pressed strength of the conductive ball 125. In this case, if the conductive ball 125 is seen as a small point through the microscope, then the pressed strength of the conductive ball 125 is regarded as low. Thus, it is determined that the adhesive level of the pads 115 and 117, and the connection film 133 by the conductive film is weak. On the other hand, if the conductive ball 125 is seen as a relatively large point through the microscope, then the pressed strength of the conductive ball 125 is regarded as relatively high. Thus, it is determined that the adhesive level of the pads 115 and 117, and the connection film 133 by the conductive film is strong.

As described above, according to the EL display device of the present invention, the opaque conductive layer 123 in the second pad 117 is made to expose a portion or the entire transparent conductive layer 121 by removing a portion or an entire of the opaque conductive layer 123. Therefore, it is possible to determine the adhesive level of the pads 115 and 117, and the connection film 133 by observing the pressed strength of the conductive ball 125 through the removed opaque conductive layer. Accordingly, there is no needed a destructive process, that is, a process for separating the second pad 117, from the connection film 133 in order to test the adhesive strength of the pads 115 and 117, and the connection film 133 by the conductive film in accordance with the related art, so that working hours needed to do is reduced and, in addition, the device is prevented from being abolished by the related art testing process, which results in improving a yield of the EL display device.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An electro-luminescence display device comprising:
   a connection film being connected to a driving circuit;
   a pad connected to the connection film in order to supply a driving signal from the driving circuit to a signal line formed on a substrate;
   a conductive film for connecting the connection film to the pad; and
   a plurality of dummy pads, each dummy pad including a transparent conductive layer, wherein at least one of the dummy pads is formed to expose the transparent conductive layer in order to test an adhesive level of the connection film and the pad by the conductive film.

2. The device according to claim 1, wherein each of the dummy pads includes: an opaque conductive layer formed on the transparent conductive layer.

3. The device according to claim 1, wherein at least one of the dummy pads includes an alignment mark for aligning the connection film and the pad.

4. The device according to claim 2, wherein any one of the dummy pads has a single-layer structure of the transparent conductive layer, and the remaining dummy pads have a double-layer structure of the transparent conductive layer and the opaque conductive layer.

5. The device according to claim 2, wherein the opaque conductive layer exposes at least a portion of the transparent conductive layer.

* * * * *